US012446266B1

(12) United States Patent
Tan et al.

(10) Patent No.: US 12,446,266 B1
(45) Date of Patent: Oct. 14, 2025

(54) Fe-FET STRUCTURE WITH BURIED ELECTRODE

(71) Applicant: GlobalFoundries Singapore Pte. Ltd., Singapore (SG)

(72) Inventors: Shyue Seng Tan, Singapore (SG); Kian Ming Ng, Singapore (SG); Eng Huat Toh, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/956,395

(22) Filed: Nov. 22, 2024

(51) Int. Cl.
| H10B 51/30 | (2023.01) |
| H10D 30/01 | (2025.01) |
| H10D 30/69 | (2025.01) |
| H10D 64/01 | (2025.01) |
| H10D 64/68 | (2025.01) |

(52) U.S. Cl.
CPC .......... H10D 30/701 (2025.01); H10B 51/30 (2023.02); H10D 30/0415 (2025.01); H10D 64/033 (2025.01); H10D 64/689 (2025.01)

(58) Field of Classification Search
CPC .......... H10D 30/6717; H10D 30/0295; H10D 30/0287; H10D 30/701; H10D 30/0415; H10D 64/033; H10D 64/689; H10B 51/30
See application file for complete search history.

(56) References Cited

U.S. PATENT DOCUMENTS

| 10,192,972 B2 | 1/2019 | Sakai et al. | |
| 2016/0056301 A1* | 2/2016 | Lee | H10D 30/701 |
| | | | 257/295 |

FOREIGN PATENT DOCUMENTS

| CN | 118645525 A | * 9/2024 |
| DE | 102015200946 | 5/2023 |

OTHER PUBLICATIONS

Machine Translation of CN 118645525 A, 2024.*
Improved translation of Li et al. (CN 118645525 A) (Year: 2024).*
Aabrar et al., BEOL-Compatible Superlattice FeFET Analog Synapse With Improved Linearity and Symmetry of Weight Update, IEEE Transactions on Electron Devices, Apr. 2022, pp. 2094-2100, vol. 69, No. 4, 10.1109/TED.2022.3142239.
Jiao et al., First BEOL-compatible IGZO Ferroelectic-Modulated Diode with Drastically Enhanced Memory Window: Experiment, Modeling, and Deep Understanding, International Electron Devices Meeting (IEDM), Dec. 9, 2023, 4 pgs., IEEE 10.1109/IEDM45741.2023.10413793.
Mo et al., Experimental Demonstration of Ferroelectric HfO2 FET with Ultrathin-body IGZO for High-Density and Low-Power Memory Application, Symposium on VLSI Technology, Jun. 9, 2019, 3 pgs., IEEE 10.23919/VLSIT.2019.8776553.
Zheng et al., Boosting the Memory Window of the BEOL-Compatible MFMIS Ferroelectric/ Anti-Ferroelectric FETs by Charge Injection, Symposium on VLSI Technology and Circuits, Jun. 12, 2022, pp. 389-390, IEEE 10.1109/VLSITechnologyandCir46769.2022.9830466.

* cited by examiner

Primary Examiner — Suberr L Chi

(57) ABSTRACT

A ferroelectric transistor (FeFET) memory device includes a metal gate, a gate dielectric layer adjacent to the metal gate, a semiconductor channel layer adjacent to the gate dielectric layer, a metal drain electrode, and a metal source electrode recessed into the semiconductor channel layer. The metal gate may be oriented above or below the metal source and drain electrodes with respect to a semiconductor substrate.

20 Claims, 3 Drawing Sheets

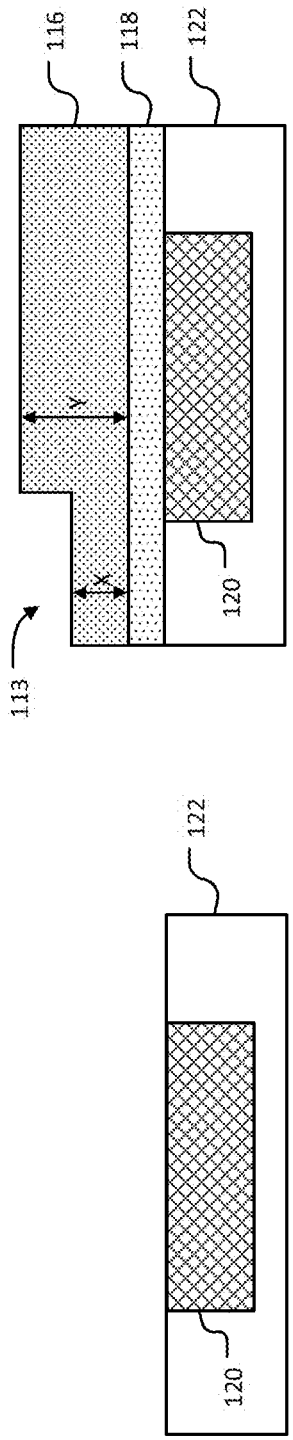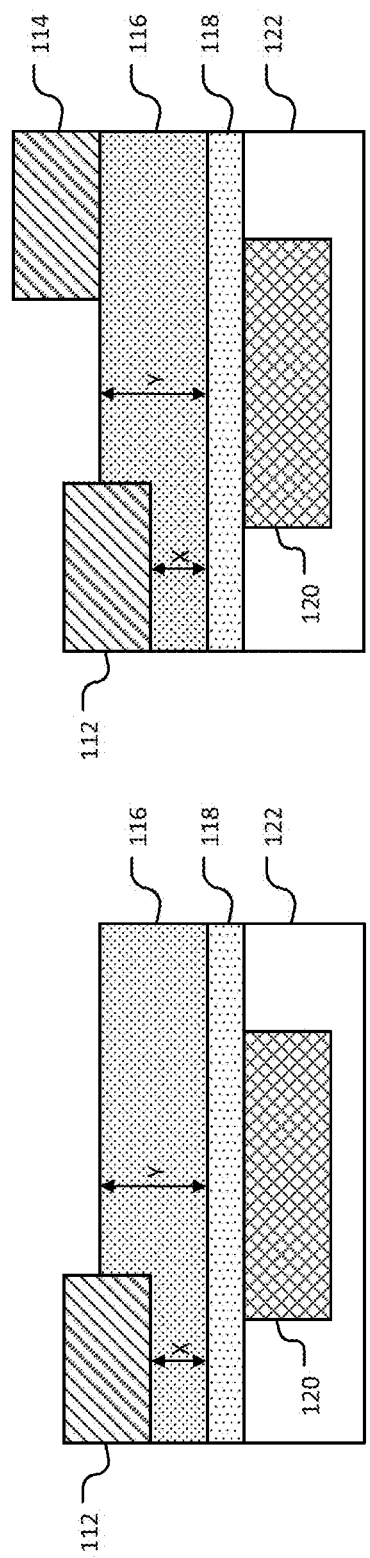

Fe-FET STRUCTURE WITH BURIED ELECTRODE

BACKGROUND

Integrated circuits may include nonvolatile memory. In some types of nonvolatile memory, so-called ferroelectric transistors (FeFETs) may be employed. Ferroelectric transistors may include a gate electrode that is formed adjacent to a channel region provided between a source region and a drain region. A layer of ferroelectric material is arranged between the gate electrode and the channel region. An electrical conductivity of the channel region of the ferroelectric transistor may be controlled by an electrical field that acts on the channel region. In addition to an electrical field that is created by applying a gate voltage to the gate electrode of the ferroelectric transistor, an electrical field caused by a ferroelectric polarization of the layer of ferroelectric material arranged between the gate electrode and the channel region may also act on the channel region of the ferroelectric transistor.

The ferroelectric polarization of the ferroelectric dielectric may be influenced by applying a programming voltage between the gate electrode and the channel region. For example, the programming voltage may be applied to the gate electrode, and the source region, the drain region and, optionally, the body of the ferroelectric transistor may be maintained at mass potential. The programming voltage may be positive or negative, depending on the desired direction of the ferroelectric polarization of the ferroelectric dielectric. The ferroelectric polarization of the ferroelectric dielectric may be maintained even if the programming voltage is no longer applied. Thus, a bit of data may be stored in the ferroelectric transistor, wherein a first polarization direction of the ferroelectric dielectric may be identified with a logical 0, and a second polarization direction of the ferroelectric dielectric may be identified with a logical 1.

For reading the stored bit of data from the ferroelectric transistor, a gate voltage may be applied between the gate electrode and the source region of the ferroelectric transistor. The gate voltage applied during the reading of the bit of data is typically lower than the programming voltage, so that the ferroelectric polarization of the ferroelectric dielectric is substantially not changed. Then, the electric current flowing through the ferroelectric transistor may be measured for determining the direction of the ferroelectric polarization of the ferroelectric dielectric. The performance of FeFETs can be improved by increasing the difference between the program and erase voltages.

SUMMARY

Embodiments of the present application relate to a ferroelectric transistor (FeFET) memory device, a semiconductor device comprising a FeFET memory device, and a method of forming a FeFET memory device.

In an embodiment, a BEOL FeFET memory device includes a metal gate, a gate dielectric layer adjacent to the metal gate, a semiconductor channel layer adjacent to the gate dielectric layer, a metal drain electrode, and a metal source electrode recessed into the semiconductor channel layer.

In an embodiment, a semiconductor device includes a semiconductor substrate and a FeFET memory device, and the FeFET memory device includes a metal gate, a gate dielectric layer adjacent to the metal gate, a semiconductor channel layer adjacent to the gate dielectric layer, a metal drain electrode, and a metal source electrode recessed into the semiconductor channel layer.

In an embodiment, a method for forming a FeFET memory device includes forming a metal gate, forming a gate dielectric layer, forming a semiconductor channel layer, forming a metal drain electrode, and forming a metal source electrode, wherein the gate dielectric layer is adjacent to the metal gate, the semiconductor channel layer is adjacent to the gate dielectric layer, and the metal source electrode is recessed into the semiconductor channel layer.

BRIEF DESCRIPTION OF THE DRAWINGS

FIGS. 5A to 5D illustrate an embodiment of a method for forming a FeFET memory device.

DETAILED DESCRIPTION

Figure 1:
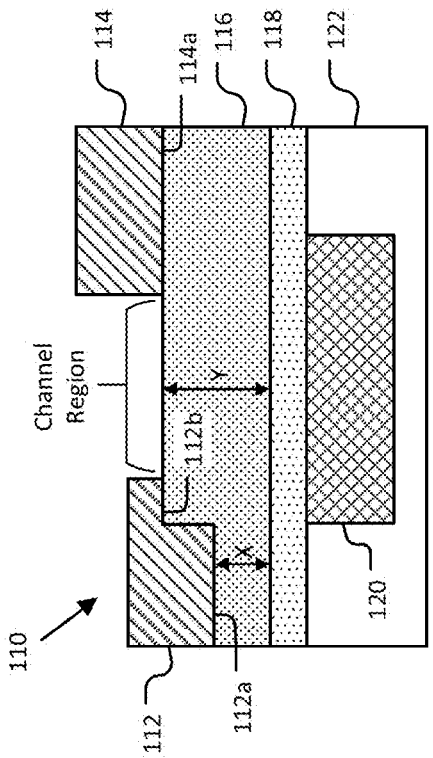
FIG. 1 illustrates a first embodiment of a FeFET memory device.

A detailed description of embodiments is provided below along with accompanying figures. The scope of this disclosure is limited by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured. The figures are not drawn to scale, and features are enlarged or diminished for visual clarity.

Embodiments described herein relate to a ferroelectric field effect transistor (FeFET) structure in which a source metal electrode is buried in a semiconductor channel layer.

In various embodiments, a surface of the source metal electrode of a FeFET structure which faces an associated ferroelectric high-K gate dielectric material and metal gate is closer to the ferroelectric high-K gate dielectric material and metal gate than a surface of the drain metal electrode which faces the ferroelectric high-K gate dielectric material and metal gate. In some embodiments of the present disclosure, the source metal electrode is buried in the semiconductor channel layer and the drain metal electrode is located outside (e.g. above) the semiconductor channel layer. In another embodiment, both of the source and drain metal electrodes are buried in the semiconductor channel, and the drain electrode is buried to a depth that is greater than the depth at which the drain electrode is buried. The source electrode may have a stepped shape in which a portion of the source metal electrode which overlaps with the metal gate is thinner than a portion of the source metal electrode which does not overlap with the metal gate. Accordingly, examples of a FeFET structure according to the present disclosure have an asymmetric arrangement of metal source and drain electrodes.

Semiconductor circuit elements of the present disclosure, and particularly semiconductor devices discussed with respect to illustrative embodiments, concern elements and devices may be fabricated by using advanced technologies. Semiconductor circuit elements of the present disclosure may be fabricated by technologies applied to approach technology nodes smaller than 100 nm, for example, smaller than 50 nm or smaller than 35 nm. After a complete reading of the present application, a person skilled in the art will appreciate that the present disclosure suggests semiconductor circuit elements that may have structures with minimal length and/or width dimensions smaller than 100 nm, for example, smaller than 50 nm or smaller than 35 nm. For example, the present disclosure may provide for semiconductor devices fabricated by using 45 nm technologies or below, e.g., 28 nm or below.

FIG. 1 illustrates a cross-sectional view of a first embodiment of a FeFET memory device 110. The FeFET memory device 110 includes a metal source electrode 112 and a metal drain electrode 114. The metal source electrode 112 and metal drain electrode 114 may be formed of the same metal material. Examples of a metal material of the source and drain electrodes 112 and 114 include tungsten, tantalum, platinum and titanium, and extend to combinations (e.g. alloys and compounds) of metals. Although not shown in the figures, the metal source and drain electrodes 112 and 114 may comprise one or more liner material as known in the art.

The metal source electrode 112 is buried in a semiconductor channel layer 116, which comprises the channel region of the FeFET. The semiconductor channel layer 116 may comprise a semiconductor material such as indium gallium zinc oxide (IGZO), tungsten doped indium oxide (IWO), or amorphous silicon, for example.

The semiconductor channel layer 116 in FIG. 1 has two different depths: a first depth X under the metal source electrode 112, and a second depth Y under the metal drain electrode 114 which is greater than the first depth X. The first depth X is a distance from the metal source electrode 112 to the gate dielectric layer 118, and the second depth Y is a distance from the metal drain electrode 114 to the gate dielectric layer 118 and a maximum depth of semiconductor channel layer 116. The first depth X may be, for example, from zero to 45 nanometers, and the second depth Y may be, for example, from 10 to 50 nanometers. When the depth X is zero, the metal source electrode 112 contacts the gate dielectric layer 118.

The thickness and width of the metal source and drain electrodes 112 and 114 may be in the nanometer scale, e.g. from sub-nanometer to 200 nanometers thick in a non-limiting example. A channel region of the FeFET is located in the semiconductor channel layer 116 between the source electrode 112 and the drain electrode 114.

The material of gate dielectric layer 118 is not particularly limited and may be a ferroelectric high-K dielectric material such as an oxide of hafnium or zirconium. When the ferroelectric high-K dielectric material comprises hafnium, it may comprise other elements such as zirconium, yttria or silicon. In a non-limiting example, the dielectric material is zirconium doped hafnium oxide. Other embodiments are possible as known in the art. A thickness of the gate dielectric layer 118 may be in a range between about 4-20 nm, for example.

The FeFET memory device 110 further comprises a metal gate 120 in an insulation layer 122. The metal gate 120 may comprise a conductive metal material as known in the art, including alloys and compounds of various metals. The insulation layer 122 may comprise an insulation material such as silicon oxide material. The insulation material 122 may be an interlayer dielectric (ILD) layer in a back end of line (BEOL) region of a semiconductor device 100.

In the embodiment shown in FIG. 1, the metal source electrode 112 is buried, or recessed, into semiconductor channel layer 116, and the entire metal drain electrode 114 is outside of the semiconductor channel layer 116. A planar surface 114a of the metal drain electrode 114 that faces the gate 120 is co-planar with a surface of the semiconductor channel layer 116. A surface 112a of the metal source electrode 112, which faces and is closest to gate 120, is closer to the gate 120 than the surface 114a of the metal drain electrode 114 which faces and is closest to gate 120.

Figure 2:
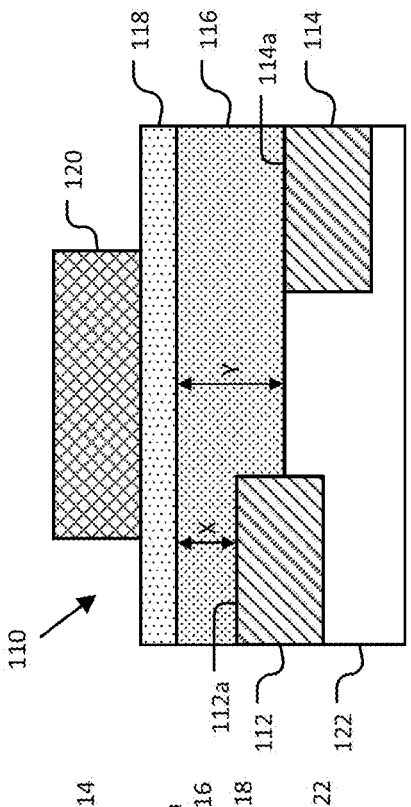
FIG. 2 illustrates a second embodiment of a FeFET memory device.

FIG. 2 illustrates a second embodiment of a FeFET memory device 110. In the second embodiment, the metal source electrode 112 has two different thicknesses. A first portion of the metal source electrode 112 has a first thickness, which is a thickness between the upper surface of the electrode with respect to the orientation of FIG. 2 and surface 112a, and a second portion has a second thickness between the upper surface and surface 112b. The second, lesser thickness is in a portion of the metal source electrode 112 that overlaps with metal gate 120, and surface 112b is coplanar with an upper surface of semiconductor channel layer 116. In this embodiment, surface 114a of the metal drain electrode 114 is coplanar with surface 112b and the upper surface of semiconductor channel layer 116. The metal source electrode 112 in FIG. 2 may be characterized as having a stepped shape.

Figure 3:
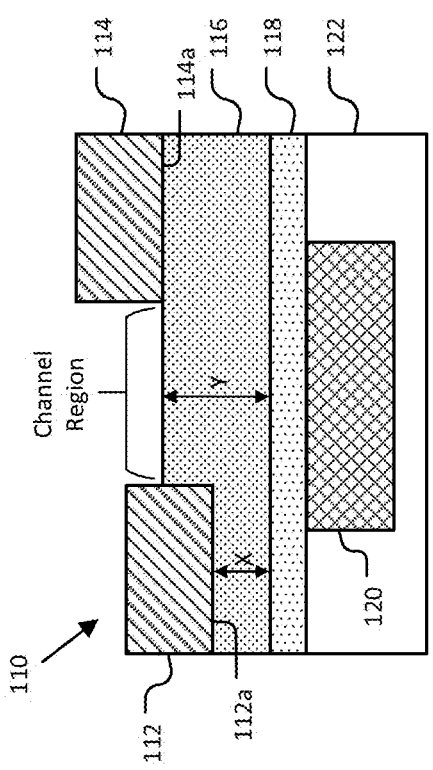
FIG. 3 illustrates a third embodiment of a FeFET memory device.

FIG. 3 illustrates a third embodiment of a FeFET memory device 110 in which the metal source electrode 112 is fully buried in semiconductor channel layer 116 and metal drain electrode 114 is partially buried in semiconductor channel layer 116. The semiconductor channel layer 116 in the third embodiment has three different thicknesses: a first thickness X, a second thickness Y, and a third thickness Z. The surface of semiconductor layer having the thickness Z is coplanar with a surface of the metal source electrode 112, while surfaces 112b and 112a are buried in the semiconductor channel layer 116. Surface 112b of the metal source electrode 112 is coplanar with surface 114a of the metal drain electrode 114, and surface 112b overlaps with the metal gate 120.

Figure 4:
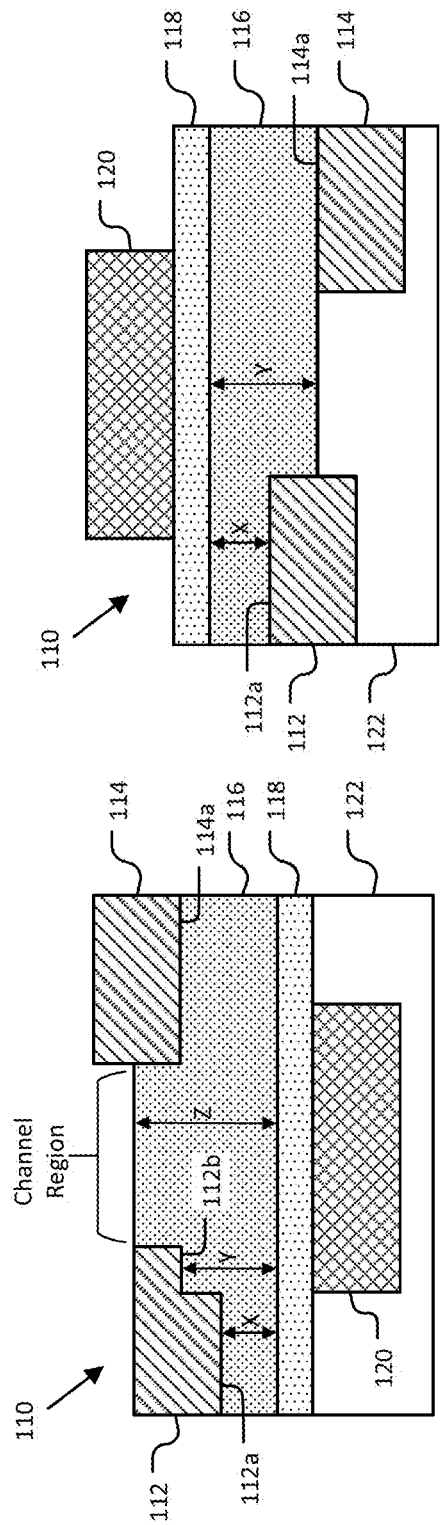
FIG. 4 illustrates a fourth embodiment of a FeFET memory device.

FIG. 4 illustrates a fourth embodiment of a FeFET memory device 110. The components of the FeFET in FIG. 4 are the same as those shown in the first embodiment of FIG. 1, except the orientation is inverted. Accordingly, embodiments may be oriented with the metal gate 120 either above or below the metal electrodes 112 and 114 with respect to a semiconductor substrate. In the fourth embodiment, the metal source electrode 112 is recessed into the semiconductor channel layer 116 in the opposite direction from the first embodiment.

FIGS. 5A to 5D illustrate an example of a method for forming the FeFET memory device 110 of FIG. 1. The insulation layer 122 may be formed as an ILD in a BEOL or FEOL process. Metal gate 120 may be formed by a damascene process, e.g. forming a pattern with a photoresist layer (not shown), etching the insulation layer 122 using the pattern as an etch mask to create openings in the insulation material, removing the photoresist layer, filling the openings with a layer of metal material, and leveling the metal material with a planarization process such as chemical mechanical polishing (CMP). The etch and deposition processes may be selected from processes known in the art. For example, the etch process may be a wet or dry etch process, and the deposition process may be a chemical vapor deposition (CVD) or plasma enhanced chemical vapor deposition (PECVD) process. In some embodiments, the metal gate 120 may be formed at the same time as other metal structures.

A ferroelectric high-K dielectric material may be deposited over the metal gate 120 and insulation layer 122 to form gate dielectric layer 118. The layer of ferroelectric high-K dielectric material may be formed using conventional deposition techniques for the deposition of ferroelectric high-K dielectric material, such as CVD, PECVD and/or atomic layer deposition (ALD). The ferroelectric high-K dielectric material then may be patterned to isolate FeFET memory devices 110.

A layer of semiconductor material may be deposited over the gate dielectric layer 118 using a deposition process appropriate for the semiconductor material. In some embodiments, the semiconductor material is leveled using a planarization process after deposition. An opening 113 is etched in the semiconductor material, e.g. using a photoresist pattern, to form semiconductor channel layer 116 as shown in FIG. 5B. In the resulting structure, a portion of the semiconductor channel layer 116 has a first depth "X" and another portion of the semiconductor channel layer 116 has a second depth "Y". When forming the embodiment shown in FIG. 3, a second etching process may be performed to create a second recess in semiconductor channel layer 116 corresponding to depth "Y" in FIG. 3. The embodiment of FIG. 3 may be formed by a dual damascene process.

Metal source electrode 112 may be formed by depositing a metal material over the exposed surface of semiconductor channel layer 116, planarizing the metal material, and patterning the metal material using a photoresist mask to form the structure shown in FIG. 5C. The size of the pattern may be adapted so that the width of metal source electrode 112 is the same as the width of opening 113 to form the embodiment of FIG. 1, or overlaps with a portion of the semiconductor channel layer 116 having thickness "Y" to form the embodiment of FIG. 2.

In still another embodiment, when the depth X is zero, source metal electrode 112 may be formed using a patterning process on the surface of get dielectric layer 118. In such an embodiment, semiconductor channel layer 116 may be formed by depositing the semiconductor material over the dielectric layer 118 and the source metal electrode 112 and removing portions of the semiconductor material using a combination of etching and/or planarization processes until the semiconductor channel layer 116 has the depth Y.

Metal drain electrode 114 may be subsequently formed using a patterning process. For example, a sacrificial pattern (not shown) may be formed over the metal source electrode 112 and semiconductor channel layer 116, a metal material may be deposited over the sacrificial pattern and planarized, and the sacrificial pattern may be removed, resulting in the structure shown in FIG. 5D.

Although FIGS. 5A to 5D are described with respect to the gate orientations shown in the embodiments of FIGS. 1, 2, and 3, persons of skill in the art will recognize that similar etch, patterning and deposition techniques may be performed to form a FeFET memory device 110 with the orientation of FIG. 4.

Figure 6:
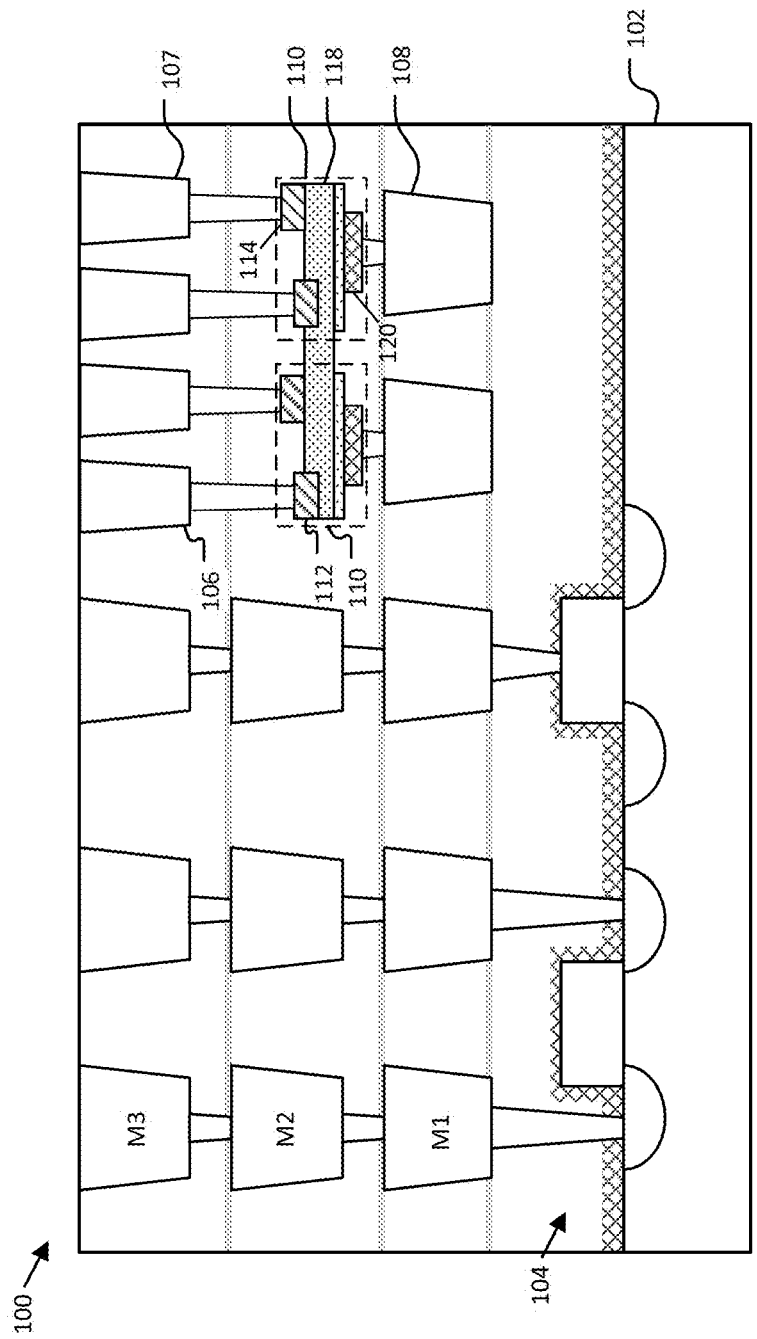
FIG. 6 illustrates an embodiment of a semiconductor device with BEOL FeFET memory devices.

FIG. 6 illustrates a simplified cross-sectional view of a semiconductor device 100 comprising FeFET memory devices 110 according to an embodiment of the present disclosure. The semiconductor device 100 includes an active region 104 formed on a semiconductor substrate 102. The semiconductor substrate may comprise one or more semiconductor material such as silicon, gallium, germanium, gallium nitride, etc. The active region 104 may include active components or circuits, such as conductive features, implantation regions, resistors, capacitors, and other semiconductor elements, e.g., transistors, diodes, etc. that are formed using front-end-of-line (FEOL) processes.

Also shown in FIG. 6 are metal lines of metal layers M1-M3, each corresponding to a BEOL metal layer. Although only three metal layers are shown in the figure, embodiments may comprise ten or more metal layers in the BEOL portion of the device 100. The metal lines are electrically insulated from one another by an interlayer dielectric (ILD) material.

Each of the metal lines may be coupled to a vertically adjacent metal line by a via. Vias are formed by etching via holes using conventional mask patterning and etch processes as known in the art and depositing a conductive material in the via holes. The metal lines and vias may include conductive materials typically used in BEOL processes, such as copper, aluminum, tungsten, titanium, titanium nitride, tantalum, tantalum nitride, or multiple layers or combinations thereof.

In the example of FIG. 6, two FeFET memory devices 110 are located in BEOL metal layer M2. In embodiments, FeFET memory devices 110 may be in various BEOL metal layers of the device 100. The metal source electrodes 112 are coupled to conductive structures 106 which may be source lines, the metal drain electrodes 114 are coupled to conductive structures 107 which may be drain lines, and the metal gates 120 are coupled to conductive structures 108 which may be wordlines. A semiconductor device 100 may comprise an array of FeFET memory devices 110, and in some embodiments, multiple FeFET memory devices 110 may be located on different BEOL metal layers within the same device.

In some implementations of the embodiments described herein, a FeFET memory device 110 includes a metal gate 120, a gate dielectric layer 118 adjacent to the metal gate 120, a semiconductor channel layer 116 adjacent to the gate dielectric layer 118, a metal drain electrode 114, and a metal source electrode 112 recessed into the semiconductor channel layer 116. A cross-sectional shape of the metal source electrode 112 may be different from a cross-sectional shape of the metal drain electrode 114. For example, as seen in FIG. 2, the metal source electrode 112 may have a stepped shape, and the metal drain electrode 114 may have a quadrangular shape such as a rectangle shape, a square shape, or a trapezoidal shape.

In some implementations of the embodiments described herein, a surface of the metal source electrode 112 that faces the gate dielectric layer 118 (e.g. surface 112a) is closer to the gate dielectric layer 118 than a surface of the metal drain electrode 114 that faces the metal gate (e.g. surface 114a).

In some implementations of the embodiments described herein, a first portion of the metal source electrode vertically aligned with the metal gate has a first thickness, and a second portion of the metal source electrode has a second thickness greater than the first thickness. As seen in FIGS. 1 and 2, in some embodiments, the metal drain electrode 114 may be located outside of the semiconductor channel layer 116.

In some implementations of the embodiments described herein, the semiconductor channel layer 116 may have at least three different thicknesses. For example, as seen in FIG. 3, the semiconductor channel layer 116 may have a first thickness X, a second thickness Y, and a third thickness Z which are different from one another. The semiconductor channel layer 116 may have a fourth thickness under the drain electrode 114.

In some implementations of the embodiments described herein, the metal drain electrode 114 is recessed into the semiconductor channel layer 116 by a depth that is less than a depth to which the metal source electrode 112 is recessed into the semiconductor channel layer. A thickness of the semiconductor channel layer 116 may be from 10 to 50 nanometers, and the gate dielectric layer 118 may comprise a thickness of from 4 to 20 nanometers of ferroelectric high-K dielectric material.

While some embodiments above have been described with respect to FeFET memory devices within a BEOL portion of a semiconductor device, the scope of the present disclosure is not so limited. In other embodiments, a FeFET may be located in a FEOL portion of a semiconductor device.

Embodiments of the present disclosure may have improved performance characteristics compared to conventional FeFET memory devices. For example, embodiments may have an increased ratio between programming and erase voltages.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting. Processing steps are not limited to being performed in the order in which they are presented in the claims.

The invention claimed is:

1. A ferroelectric transistor (FeFET) memory device comprising:
   a metal gate;
   a gate dielectric layer adjacent to the metal gate;
   a semiconductor channel layer adjacent to the gate dielectric layer;
   a metal drain electrode; and
   a metal source electrode recessed into the semiconductor channel layer,
   wherein the metal gate is vertically spaced apart from the semiconductor channel layer, the metal source electrode, and the metal drain electrode by the gate dielectric layer.

2. The FeFET memory device of claim 1, wherein a cross-sectional shape of the metal source electrode is different from a cross-sectional shape of the metal drain electrode.

3. The FeFET memory device of claim 2, wherein the cross-sectional shape of the metal source electrode is a stepped shape, and the cross-sectional shape of the metal drain electrode is a quadrangular shape.

4. The FeFET memory device of claim 1, wherein a surface of the metal source electrode that faces the gate dielectric layer is closer to the gate dielectric layer than a surface of the metal drain electrode that faces the metal gate.

5. The FeFET memory device of claim 1, wherein a first portion of the metal source electrode is vertically aligned with the metal gate and has a first thickness, and a second portion of the metal source electrode has a second thickness greater than the first thickness.

6. The FeFET memory device of claim 1, wherein the metal drain electrode is located outside of the semiconductor channel layer.

7. The FeFET memory device of claim 1, wherein a thickness of the semiconductor channel layer is from 10 to 50 nanometers.

8. The FeFET memory device of claim 1, wherein the semiconductor channel layer has at least three different thicknesses.

9. The FeFET memory device of claim 1, wherein the gate dielectric layer comprises a thickness of from 4 to 20 nanometers of ferroelectric high-K dielectric material.

10. The FeFET memory device of claim 1, wherein the metal drain electrode is recessed into the semiconductor channel layer by a depth that is less than a depth to which the metal source electrode is recessed into the semiconductor channel layer.

11. A semiconductor device comprising:
    a semiconductor substrate; and
    a ferroelectric transistor (FeFET) memory device comprising:
      a metal gate;
      a gate dielectric layer adjacent to the metal gate;
      a semiconductor channel layer adjacent to the gate dielectric layer;
      a metal drain electrode; and
      a metal source electrode recessed into the semiconductor channel layer,
      wherein the metal gate is vertically spaced apart from the semiconductor channel layer, the metal source electrode, and the metal drain electrode by the gate dielectric layer.

12. The semiconductor device of claim 11, wherein a cross-sectional shape of the metal source electrode is different from a cross-sectional shape of the metal drain electrode.

13. The semiconductor device of claim 12, wherein the cross-sectional shape of the metal source electrode is a stepped shape, and the cross-sectional shape of the metal drain electrode is a quadrangular shape.

14. The semiconductor device of claim 11, wherein a surface of the metal source electrode that faces the gate dielectric layer is closer to the gate dielectric layer than a surface of the metal drain electrode that faces the metal gate.

15. The semiconductor device of claim 11, wherein a first portion of the metal source electrode is vertically aligned with the metal gate and has a first thickness, and a second portion of the metal source electrode has a second thickness greater than the first thickness.

16. The semiconductor device of claim 11, wherein the metal drain electrode is located outside of the semiconductor channel layer.

17. The semiconductor device of claim 11, wherein a thickness of the semiconductor channel layer is from 10 to 50 nanometers.

18. The semiconductor device of claim 11, wherein the semiconductor channel layer has at least three different thicknesses.

19. The semiconductor device of claim 11, wherein the FeFET memory device is located in a back end of line (BEOL) portion of the semiconductor device.

20. A method for forming a ferroelectric transistor (FeFET) memory device, the method comprising:
    forming a metal gate;
    forming a gate dielectric layer;

forming a semiconductor channel layer;
forming a metal drain electrode; and
forming a metal source electrode,
wherein the gate dielectric layer is adjacent to the metal gate, the semiconductor channel layer is adjacent to the gate dielectric layer, and the metal source electrode is recessed into the semiconductor channel layer, and
wherein the metal gate is vertically spaced apart from the semiconductor channel layer, the metal source electrode, and the metal drain electrode by the gate dielectric layer.

\* \* \* \* \*